(12) United States Patent
Doerr et al.

(10) Patent No.: US 11,432,056 B1
(45) Date of Patent: Aug. 30, 2022

(54) SWITCH (71) Applicant: Acacia Communications, Inc., Maynard, MA (US)

(72) Inventors: Christopher Doerr, Middletown, NJ (US); Benny Mikkelsen, Newton, MA (US); Ian Dedic, London (GB); John LoMedico, Boston, MA (US); Song Jiang, Watchung, NJ (US)

(73) Assignee: Acacia Communications, Inc., Maynard, MA (US)

( * ) Notice: Subject to any disclaimer, the term of this patent is extended or adjusted under 35 U.S.C. 154(b) by 0 days.

(21) Appl. No.: 16/938,721

(22) Filed: Jul. 24, 2020

Related U.S. Application Data

(60) Provisional application No. 62/879,095, filed on Jul. 26, 2019.

(51) Int. Cl.
*H04Q 11/00* (2006.01)
*G02B 6/42* (2006.01)
*H01L 25/18* (2006.01)
*H04B 10/25* (2013.01)

(52) U.S. Cl.
CPC ......... *H04Q 11/0005* (2013.01); *G02B 6/421* (2013.01); *G02B 6/4269* (2013.01); *G02B 6/4292* (2013.01); *H01L 25/18* (2013.01); *H04B 10/25* (2013.01); *H04Q 2011/0039* (2013.01)

(58) Field of Classification Search
CPC .... G02B 6/421; G02B 6/4269; G02B 6/4292; H04Q 11/0005; H04Q 2011/0007; H04Q 2011/0039

See application file for complete search history.

(56) References Cited

U.S. PATENT DOCUMENTS

| | | | |
|---|---|---|---|
| 2002/0110332 A1* | 8/2002 | Clarkin | G02B 6/02209 385/78 |
| 2002/0132533 A1* | 9/2002 | Figueroa | H05K 1/0231 439/862 |
| 2005/0129348 A1* | 6/2005 | Iwasaki | G02B 6/43 385/14 |
| 2016/0226592 A1* | 8/2016 | Arvelo | H01S 5/423 |
| 2017/0212321 A1* | 7/2017 | Gronvall | G02B 6/4452 |
| 2018/0209635 A1* | 7/2018 | Luiten | F21V 29/713 |
| 2020/0271873 A1* | 8/2020 | Chang | H01L 24/24 |
| 2020/0279840 A1* | 9/2020 | Janta-Polczynski | H01L 23/5385 |
| 2020/0304920 A1* | 9/2020 | Achehboune | H04R 19/005 |

* cited by examiner

*Primary Examiner* — Nathan M Cors
(74) *Attorney, Agent, or Firm* — Joseph D'Angelo (57) ABSTRACT

An apparatus and system, including a switch; and a set of tiles; wherein each of the set of tiles include a PIC die, a DSP die, a driver die, and a TIA die and methods thereto.

15 Claims, 7 Drawing Sheets

SWITCH

RELATED APPLICATION

The present application claims the benefit of U.S. Provisional Patent Application Ser. No. 62/879,095 filed Jul. 26, 2019 entitled "Switch," which is hereby incorporated herein by reference in its entirety.

BACKGROUND

Switching or routing of data is often important in transferring data.

BRIEF DESCRIPTION OF THE FIGURES

Various aspects and embodiments of the application will be described with reference to the following example embodiments. It should be appreciated that the figures are not necessarily drawn to scale.

SUMMARY

An apparatus and system, including a switch; and a set of tiles; wherein each of the set of tiles include a PIC die, a DSP die, a driver die, and a TIA die and methods thereto.

DETAILED DESCRIPTION

In many embodiments, the current disclosure may enable an electronic switch with optical input/output. In certain embodiments, the current disclosure may enable switching of 50 Tb/s of optical data by converting incoming optical data to electrical data, switching or routing the electrical data, and then converting the switched or routed data back to optical data using co-packaged optics (CPO). In some embodiments, an optical switch may have electrical switching technology with a plurality of optical to electrical components.

Conventionally, it has been expensive and high-power-consuming to convert optical data transmission to electrical to enable data contained in the optical transmission to be switched or routed to different locations. Generally, due to the cost of conversion between optical and electrical data transmissions, there have been attempts to switch optical data. However, switching optical data was usually switched by wavelength and was unable to switch parts of the underlying information data.

In most embodiments, Applicants have realized that through the use of multiple optical components that convert optical information into electrical information, it may be possible to inexpensively and efficiently convert and switch information contained in an optical signal. In certain embodiments, one or more techniques of the current disclosure may use direct-detect type optical components on a switch. In other embodiments, one or more techniques of the current disclosure may use coherent optical components on a switch. In some embodiments of the current disclosure, optical components with a photonic integrated circuit (PIC) may be used.

In certain embodiments, the current disclosure may enable use of short fiber jumpers between a PIC and a multi-fiber connector on a support bracket around co-packaged optics (CPO) assembly. In some embodiments, a short fiber jumper may help prevent fiber breaks due to handling and provides stress relief for an optical connection between a PIC and an incoming optical connection. In many embodiments, short fiber array jumpers may be epoxied to a PIC when a tile is in a text fixture. In some embodiments, a tile may be plugged into a socket and short fiber array jumpers may be plugged into a connector on a bracket. In certain embodiments, a short fiber jumper may be one that is less than 6 cm. In some embodiments, a fiber jumper may be attached via epoxy.

In some embodiments, there may be the use of closely spaced sockets in which tiles may be held down by screws. Conventionally, sockets have a clamp which pushes from the top. In most embodiments, Applicants have realized that a clamp may require significant surrounding real estate on a board for mounts. In most embodiments, having each tile held down by screws may eliminate a need for a clamp, which may save significant board space.

In some embodiments, there may be an arrangement where a digital-signal processor (DSP) die is flip-chipped on a substrate, a PIC right-side up and wire-bonded to a substrate, and a driver and TIA die flip-chipped on the PIC may allow for a design with excellent heat dissipation, where heavily-power-consuming dies have their backside exposed for contact to a lid, good RF performance (short connections between photodiodes and TIA input and modulators and driver output), easy fiber attach (can see waveguides), and ease of manufacture (few parts at the board assembly level, fewer thermal expansion mismatch issues). In many embodiments, having drivers and TIAs along edges of a component may provide sufficient beach front for the high-speed wirebonds. In certain embodiments, a die may refer to a block of semiconducting material on which a given functional circuit is fabricated. In many embodiments, a die may refer to a piece of wafer containing electronic and/or optical components. In some embodiments, multiple dies may be fabricated on a wafer. In many embodiments, a wafer may be diced to create multiple dies.

Figure 1:
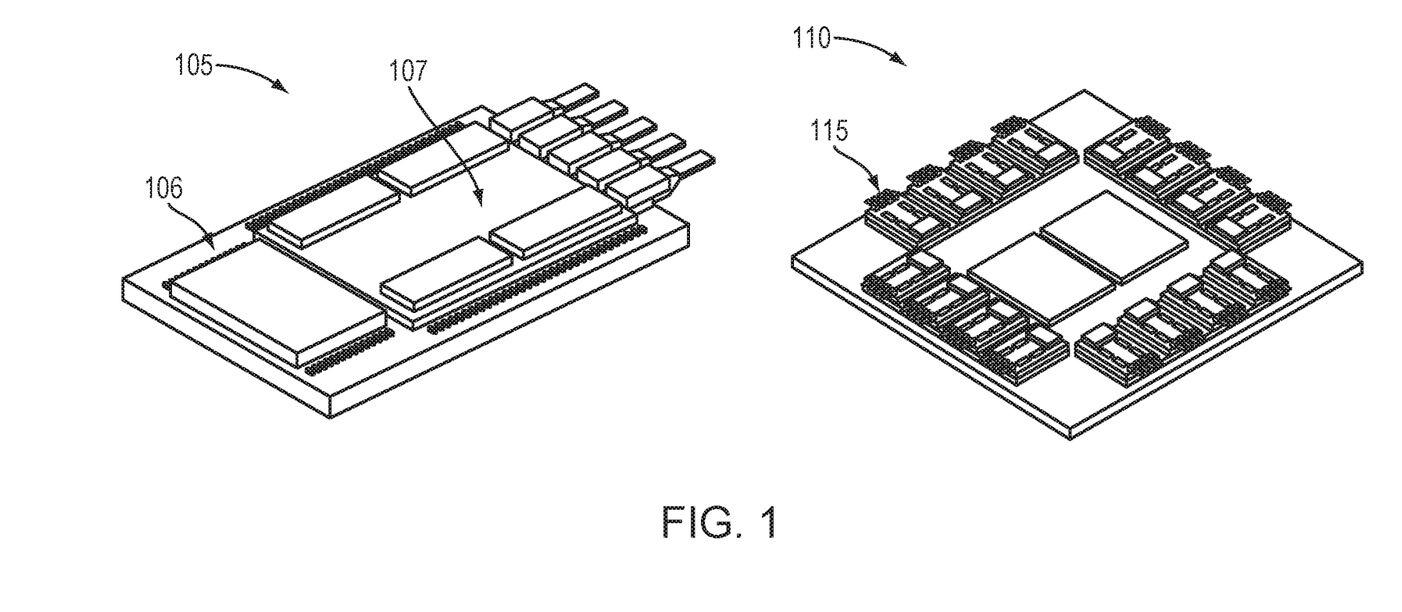
FIG. 1 is a simplified illustration of an optical switch with co-packaged optics and a tile, in accordance with an embodiment of the present disclosure.

Refer now to the example embodiment of FIG. 1 which illustrates a 50-Tb/s switch with co-packaged optics and a tile. Optical component 105 has co-packaged optics DSP 106 and PIC 107. Switch 110 has a number of optical components, such as optical component 115.

Figure 2:
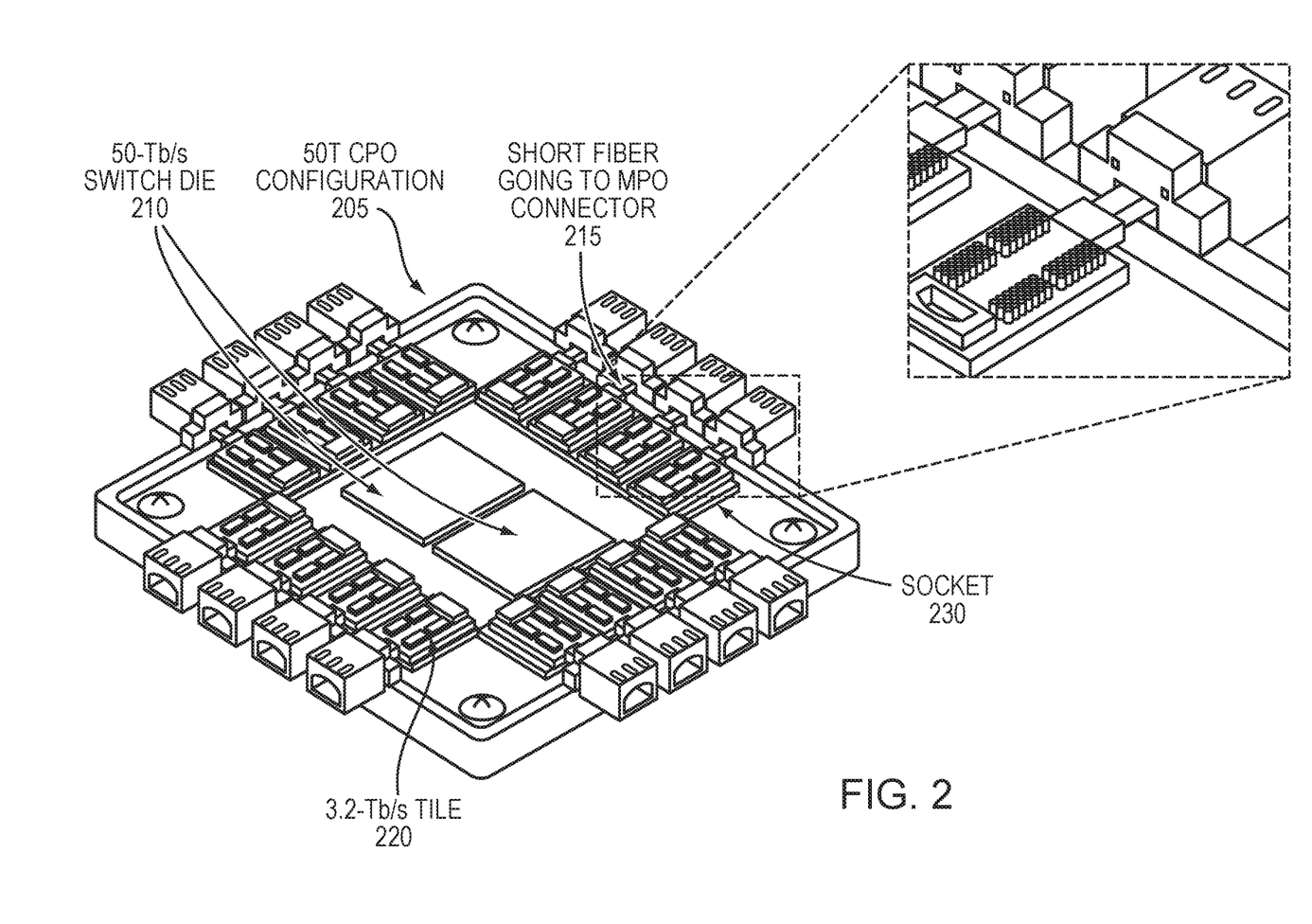
FIG. 2 is an alternative simplified illustration of an optical switch with co-packaged optics, in accordance with an embodiment of the present disclosure.

Refer now to the example embodiment of FIG. 2, which illustrates a 50 Tb/s switch. 50 Tb/s CPO switch has 20 50 Tb/s switch dies 210. 50 Tb/s CPO has 16 3.2 Tb/s tiles such as 3.2-Tb/s tiles 220. Each 3.2 Tb/s tile is mated with a socket shown as socket 230. Each 3.2-Tb/s tile has a short fiber going to a connector such as multi-fiber push-on (MPO) connector 215. In certain embodiments, a switch may comprise 16 3.2-Tb/s CPO tiles along the north, east, south, and west edges of the switch die(s). In some embodiments, each tile of a switch may comprise a digital signal processor (DSP) die side by side with a PIC die.

Figure 3:
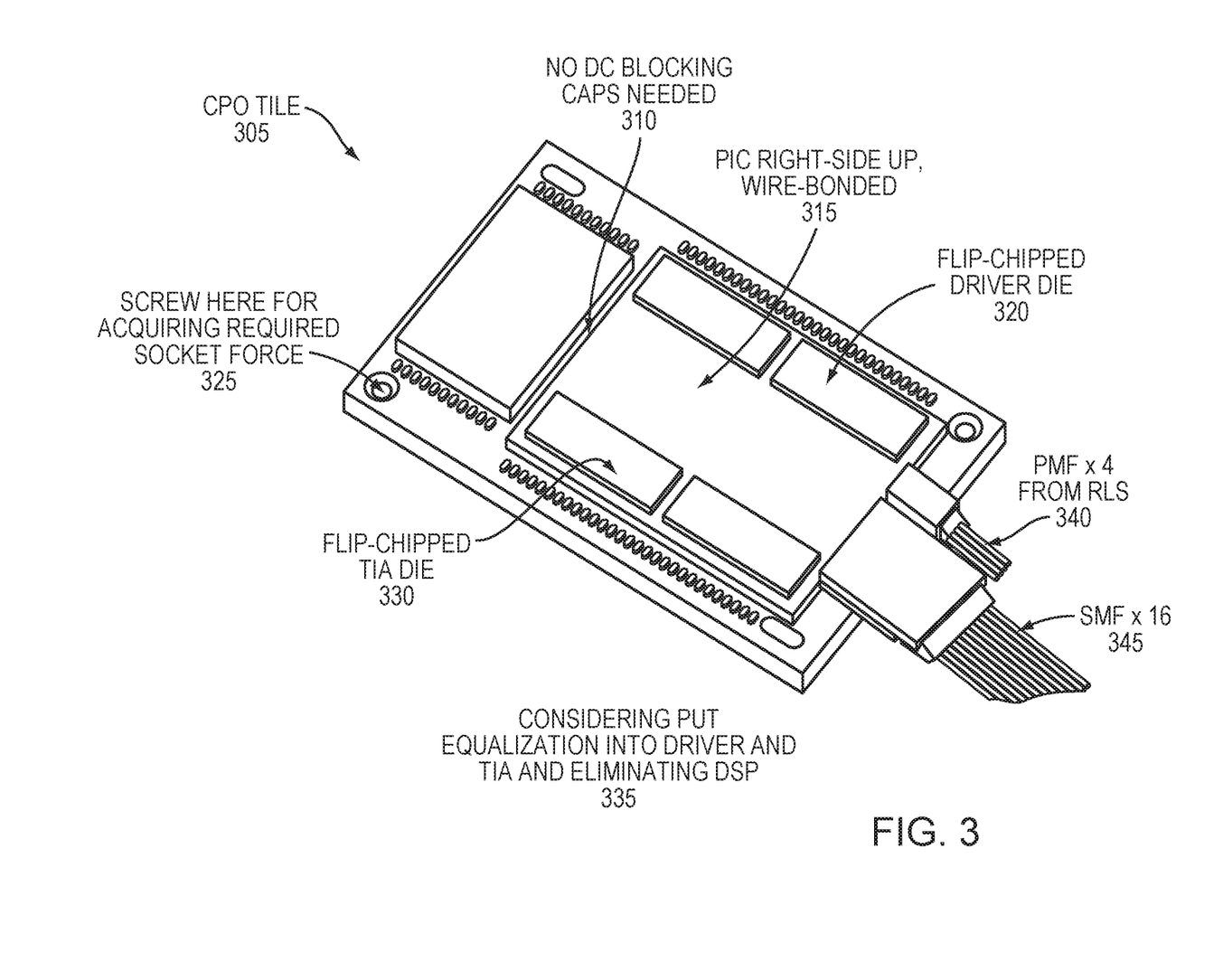
FIG. 3 is a simplified illustration of a tile with co-packaged optics, in accordance with an embodiment of the present disclosure.

Refer now to the example embodiment of FIG. 3, which illustrates a CPO tile. In the example embodiment of FIG. 3, CPO tile 305 does not need any DC-blocking capacitors between the DSP and drivers/TIAs. PIC 315 is right side up and wire bonded. Driver die 320 is flip chip bonded. CPO tile 305 has screw hole 325 required for socket source. TIA die 330 is flip chip bonded on chip 315. Polarizing maintaining fiber (PMF) 340 is connected from remote laser source (RLS). SMF 345 is connected to PIC 315.

In some embodiments, each tile of a switch may comprise a DSP die side by side with a PIC die. In some embodiments, a DSP may be flipped, and a PIC may not be flipped. In some embodiments, a PIC die may have two driver dies and two TIA dies flip-chipped on top of it. Some embodiments may support a format 400Gbase FR4. In some embodiments, 53-Gbaud PAM4 on 4 CWDM wavelengths may be used. In certain embodiments, a CPO tile may meet the IEEE specifications for 400Gbase FR4. In certain embodiments, front-end analogue control circuits may be integrated in the drivers and TIAs and the control processor for these is in the DSP, with a serial digital interface between them.

In some embodiments, a laser light may be from a remote laser source (RLS). In certain embodiments, there may be four PM fibers, each carrying one wavelength. In many embodiments, power in each fiber may be >=140 mW. In some embodiments, connected to a PIC may be 20 fibers. In a particular embodiment:
  8 SMF Tx out
  8 SMF Rx in
  4 PMF laser in In certain embodiments, tiles may be attached to a board using sockets. In some embodiments, to test a CPO:
  There may be 4 pluggable RLS modules.
  Each RLS module may supply 4 CPO tiles.
  Each RLS module may have 16 lasers and 16 PMF's exiting it.

Figure 4:
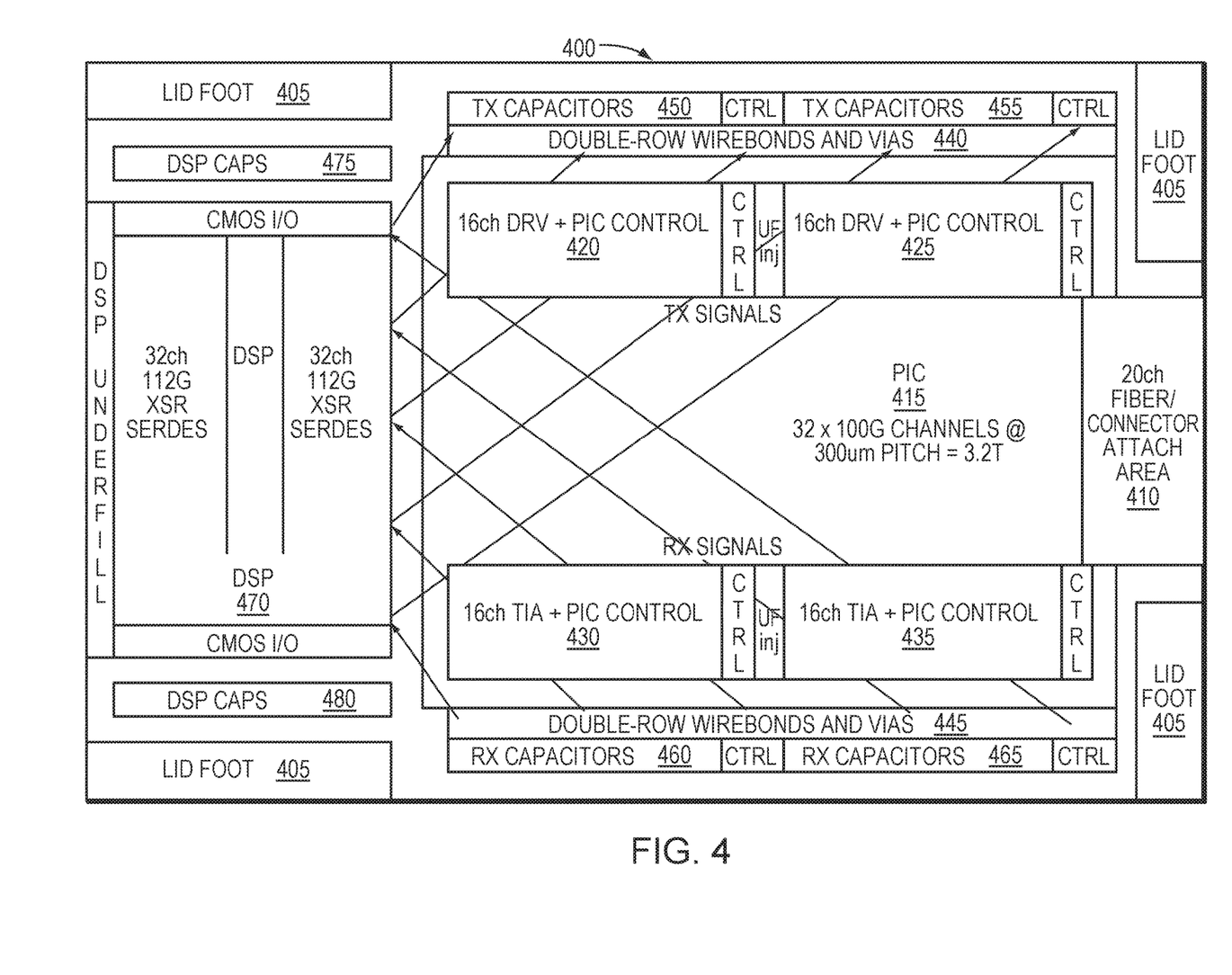
FIG. 4 is an alternative simplified illustration of a tile with co-packaged optics, in accordance with an embodiment of the present disclosure.

Refer now to the example embodiment of FIG. 4, which illustrates in more detail the arrangement of the DSP, PIC, driver, and TIA die and example dimensions for a tile. Tile 400 has four lid foots 405. Tile 400 has fiber connector 410 that connects to PIC 415. PIC 415 has four PIC controls 420, 425, 430, and 435. PIC 415 is also connected by double row wire bonds and vias 440 and 445. PIC 415 is also connected to TX capacitors 450 and 455 and RX capacitors 460 and 465. DSP 470 is connected to double-row wirebonds and vias 440 and double-row wirebonds and vias 445. DSP 470 has DSP caps 475 and 480.

In certain embodiments, signal routing may be challenging because of high density and overlap between switch-XSR (LHS of DSP) and SERDES-PIC (RHS of DSP) routing (see arrows on drawings). In some embodiments, there may be 6-2-6 or even 8-2-8 HDBU stackup. In some embodiments, low-loss materials and smooth Cu may be needed to reduce losses since track lengths are significant (>1 cm per lane). In certain embodiments, this may need a Tier 1 organic substrate supplier. In certain embodiments, a tile electrical interface may be 0.65 mm pitch BGA/LGA to match available socket technology. In other embodiments, a switch may have a new 0.4 mm pitch connector for better signal integrity for 53-Gbaud PAM4.

Figure 5:
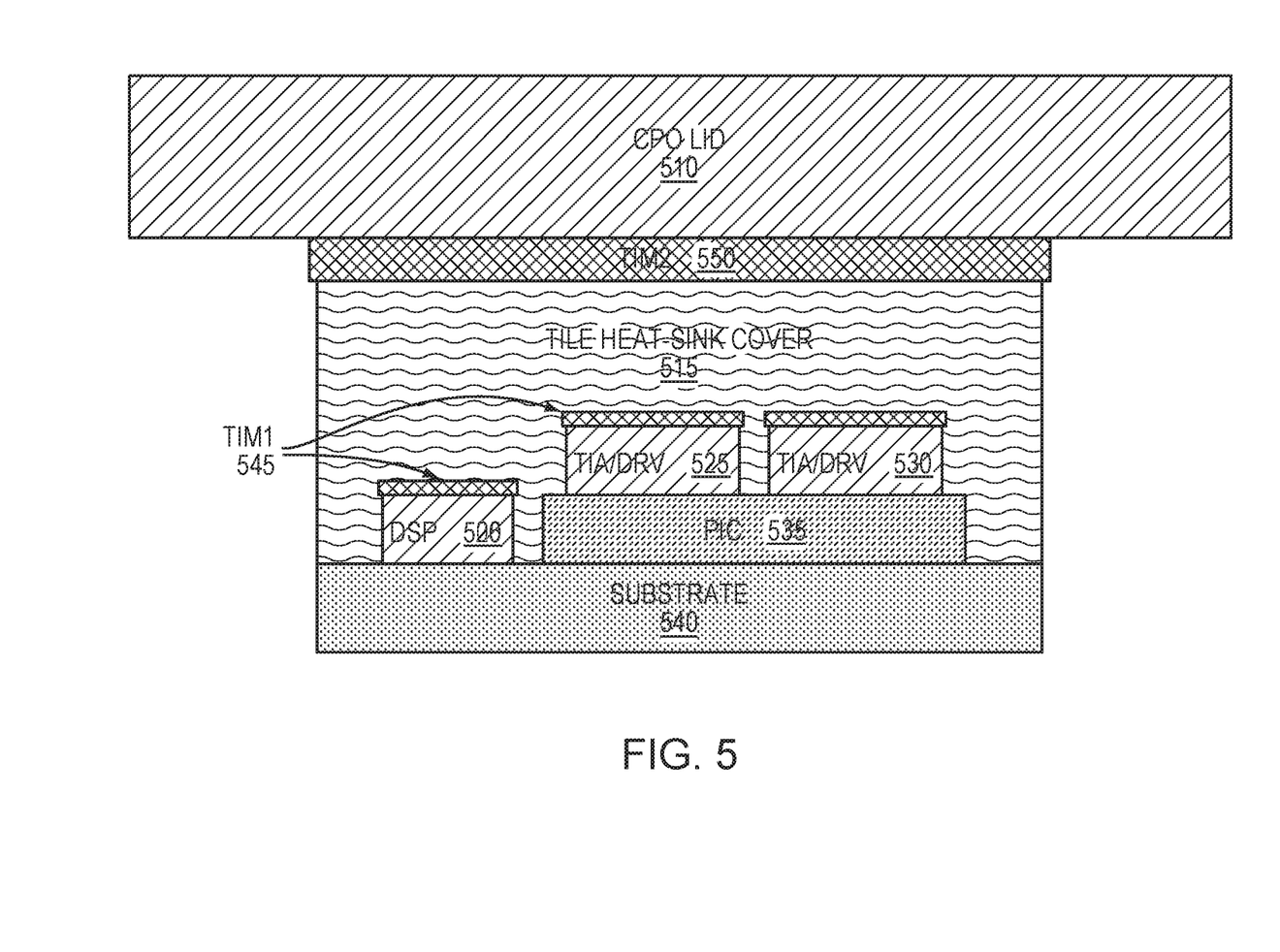
FIG. 5 is a simplified illustration of a side view of a tile with co-packaged optics, in accordance with an embodiment of the present disclosure.

Refer now to the example embodiment of FIG. 5, which illustrates a sample layout of a CPO from the side. CPO lid 510 is on the top of CPO. Under the CPO is tile heat sink cover 515. Under heat sink cover 515 is DSP 520, TIA/driver 525, and TIA/driver 530. TIA/driver 525 and TIA/driver 530 are flip chip bonded to PIC 535. DSP 520 and PIC 535 are on substrate 540. There are two thermal interface materials, thermal interface material 545 between tile heatsink cover 515 and thermal interface material 520, between TIA/driver 525 and TIA/driver 530.

In certain embodiments, one or more of the following technical specifications may be used:
  single 32ch PIC approx. face-up, wire-bonded to tile
    Bandwidth of wire bonds >50 GHz using "wire bond transmission lines"
    Standard wire bond process with optimized layout (already proved out)
  2×16ch TIA+2×16ch DRV flip-chipped on top
    Includes PIC control functions like ADC/DAC/monitor TIA/TOPS drivers
  Single DSP chip (size set by XSR SERDES)

In certain embodiments, there may be advantages if assembly and hot-spot issues use active PIC. In some embodiments, switch chip PWR/GND may have a minimum 6-2-6 stackup or 8-2-8 stackup.

In certain embodiments, the current disclosure may enable tile replacement. In some embodiments, downforce required on each tile may be around 17 kg (30 g/pin×570 pins) and a clamping mechanism may be needed to provide this downforce (270 kg total). In some embodiments, design of a clamping mechanism may need to function given restricted space available and need to avoid warpage of main CPO substrate, and work together with main module LGA socket/heatsink. In other embodiments, a screw may be used to secure a tile and may enable easy tile replacement.

In some embodiments, if sockets are used for fiber connections instead of pigtails to increase robustness, it may be possible to remove sockets and solder known-good tiles directly to a main substrate, once it has been established that the resulting yield drop is small enough (cost of rejecting bad CLO assemblies is lower than cost of sockets and mechanical assembly). In some embodiments, an array of medium-power lasers may be used. In other embodiments, single high-power lasers with power splitters may be used. In certain embodiments, there may be 4 pluggable remote laser source (RLS) modules. In many embodiments, each RLS module may supply 4 CPO tiles. In certain embodiments, each RLS module may have 16 lasers and 16 PMF's exiting it.

Figure 6:
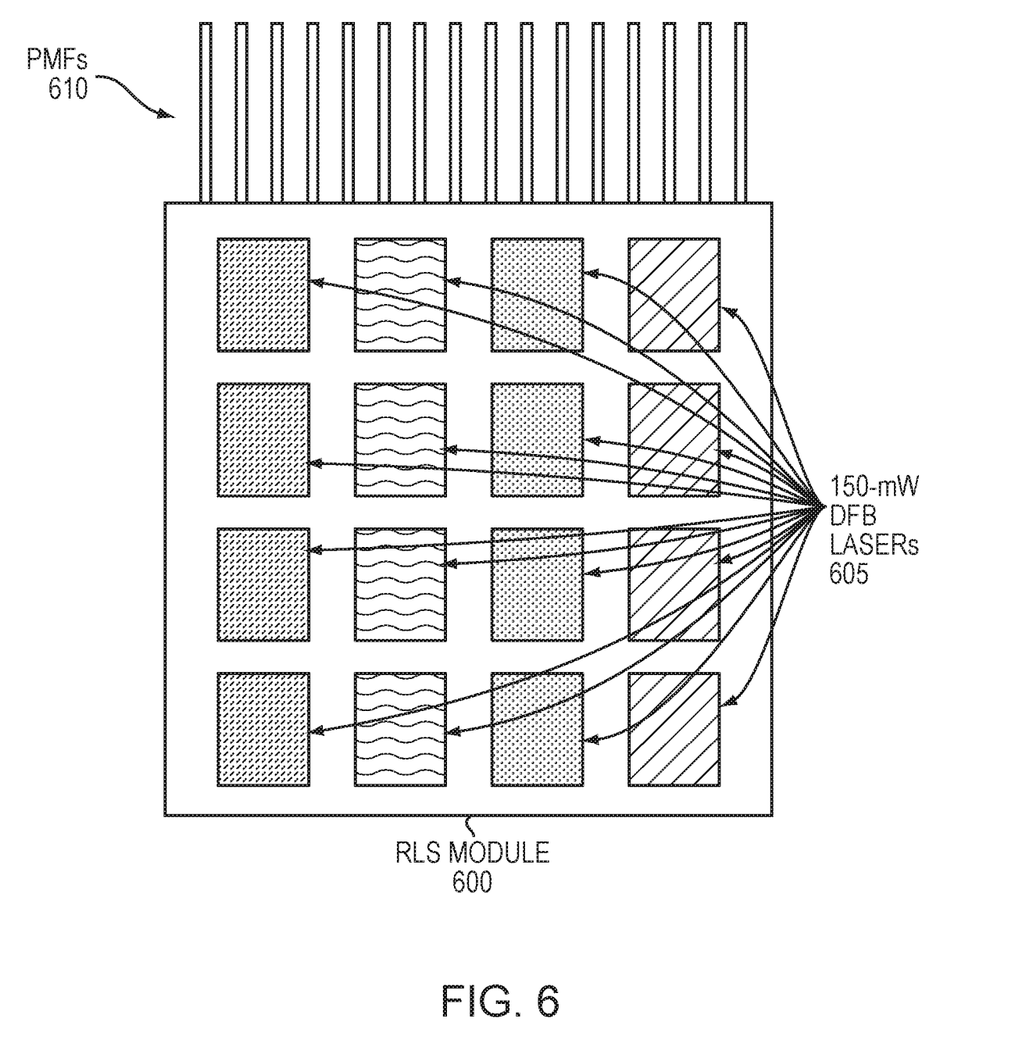
FIG. 6 is a simplified illustration of a remote laser source, in accordance with an embodiment of the present disclosure.

Refer now to the example embodiment of FIG. 6, which illustrates a RLS. RLS 600 has 16 high-power lasers 605, 4×4 wavelengths, to supply the light to the tiles. The high power lasers 605 exit RLS module 600 through 16 PMFs 610.

In some embodiments, there may be 2 or 3 analogue supplies (e.g. 1.2V, 2.5V, 4V) with standard noise/ripple requirements (e.g. 10 mV-20mVpp). In some embodiments, power supplies may be cleaned up using on-chip LDOs. In certain embodiments, total power for PIC/TIA/DRV may be at 13 W/tile (preliminary). In some embodiments, total power per tile may be at 29 W. In certain embodiments, reference clock requirements (frequency, jitter) may be set by XSR SERDES. In some embodiments, a lower-frequency clock (e.g. 10 MHz-50 MHz) may be required by TIA/DRV chips to synchronize internal ADC/DAC conversions. In some embodiments, a clock may be part of the serial control interface and may be sourced from a DSP chip or both may use a common clock.

In certain embodiments, a control of PIC, driver and TIA may be standard serial digital control interfaces (e.g. SPI) from control CPU on a DSP chip. In some embodiments, a control CPU may need enough processing power to run any required calibration algorithms in real-time on 32 optical channels and mux/demux, which should not be an issue in 7 nm or smaller CMOS. In many embodiments, a CPU with real-time response and floating-point capability may be preferred, for example ARM R4F or similar.

In some embodiments, a Driver chip may have one or more of the following specifications:
  Driver may consist of the following stages from 4V supply and 1.2V/2.5V (TBD) supply:
    Matching and predriver stage: 40 mW/ch
    4Vppd output MZM driving stage: 160 mW/ch
    Power=200 mW/channel*4 channel/400G=0.8 W per 400 Gb/s
    Total power=2 pJ/b
    Total area per channel
      300 um channel width, 1 mm channel height In some embodiments, a TIA chip may have one or more of the following specifications:
  TIA may consist of following stages from single 1.2V supply:
    Transimpedance Input stage: 40 mW/ch
    VGA stage: 40 mW/ch
    Output buffer: 40 mW/ch
    Power=120 mW/channel*4 channel/400G=0.48 W per 400 Gb/s
    Total power=1.2 pJ/b
    Total area per channel (half of SiGe TIA)
      300 um channel width, 1 mm channel height In some embodiments, a PIC/DRV/TIA control interface and calibration circuits may have one or more of the following specifications:
  ADC/DAC, power monitor TIAs, TOPS control circuits on DRV/TIA chips
  Serial digital interface (SPI?) to control processor on DSP
  300 um width per channel, 1 mm height→2 mm total chip height
  Estimated power 650 mW per 16ch chip×4=2.6 W total=0.8 pJ/b (split between DRV and TIA)

In some embodiments, total power for DRV may be=2.4 pJ/b=3.8 W/chip. In some embodiments, Total power for TIA may be=1.6 pJ/b=2.6 W/chip. In some embodiments, Total power for TIA/DRV may be=4 pJ/b=13 W total.

Figure 7:
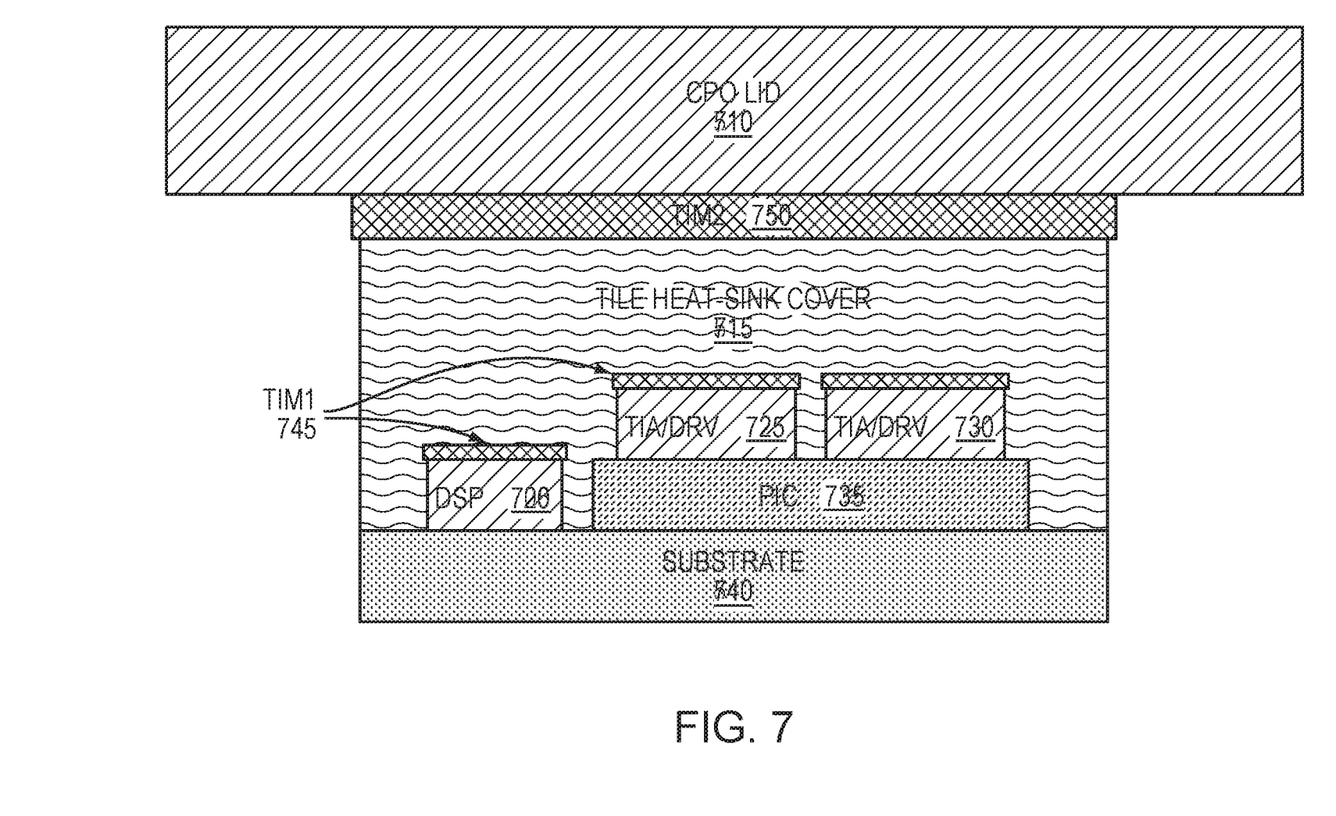
FIG. 7 is an alternative simplified illustration a of side view of a tile with co-packaged optics, in accordance with an embodiment of the present disclosure.

In some embodiments, a switch may have one or more of the following specifications:
  2 pJ/b for SERDES interfaces (switch chip and PIC)
    32ch×100G PAM4 each side
  1 pJ/b for DSP
  Total 5 pJ/b=16 W for DSP chip
  SERDES is ~2 mm deep×200 um/channel pitch
    800G "macro" is 1.64 mm tall including 400 um for digital
      Total height for 3.2 Tb is 6.56 mm
    Add 1 mm along top edge for ARM/logic+200 um/edge for I/O pads
  Total DSP chip size ~8 mm×5 mm Refer now to the example embodiment of FIG. 7. In FIG. 7, a primary heat path is routed from the backside of the die 740 through thermal interface material (TIM1) 745 to the tile cover 715. Tile cover 715 is heat-sunk to CPO lid 710 with a second TIM (TIM2) 750, which needs significant compliance for socket. In this example embodiment, assumed power dissipation is 16 W for the DSP, 3.8 W for each Tx chip, and 2.6 W for each Rx chip. The following are examples of back-side die temperatures:
  TDSP=TCPO_lid+18degC
  TDRV=TCPO_lid+14degC
  TTIA=TCPO_lid+10degC In some embodiments, with 90C CPO lid temperature 108C die backside temperature for a 7 nm/5 nm DSP may be challenging allowing for FinFET hotspots and high metal current densities, especially in 100G XSR SERDES—DRV and TIA are OK because of lower power density and larger geometry planar technology. In some embodiments, it may be necessary to reduce the specified CPO lid temperature to allow for this.

In some embodiments, a device controller may be any type of controller. In certain embodiments, a microprocessor may be a device controller and run a control loop. In other embodiments, an ASIC may be a device controller and may run a control loop. In further embodiments, a device controller may be an analog circuitry. In many embodiments, a bias controller may be a device controller. In certain embodiments, a bias controller may be an analog circuitry.

In some embodiments, one or more of the embodiments described herein may be stored on a computer readable medium. In certain embodiments, a computer readable medium may be one or more memories, one or more hard drives, one or more flash drives, one or more compact disk drives, or any other type of computer readable medium. In certain embodiments, one or more of the embodiments described herein may be embodied in a computer program product that may enable a processor to execute the embodiments. In many embodiments, one or more of the embodiments described herein may be executed on at least a portion of a processor.

In most embodiments, a processor may be a physical or virtual processor. In other embodiments, a virtual processor may be spread across one or more portions of one or more physical processors. In certain embodiments, one or more of the embodiments described herein may be embodied in hardware such as a Digital Signal Processor DSP. In certain embodiments, one or more of the embodiments herein may be executed on a DSP. One or more of the embodiments herein may be programmed into a DSP. In some embodiments, a DSP may have one or more processors and one or more memories. In certain embodiments, a DSP may have one or more computer readable storages. In many embodiments, a DSP may be a custom designed ASIC chip. In other embodiments, one or more of the embodiments stored on a computer readable medium may be loaded into a processor and executed.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

What is claimed is:

1. An apparatus comprising:
   a switch; and
   a set of tiles; wherein each of the set of tiles include a PIC die, a DSP die, a driver die, and a TIA die; wherein the PIC die is mounted to a tile substrate;
   wherein the TIA die is mounted on the PIC die;
   wherein a thermal interface material is thermally connected to the backsides of the driver die, the DSP die, and the TIA die;
   wherein the DSP die is mounted to the tile substrate and a thermally connected material is thermally connected to a top of the DSP;
   wherein the tile further includes a heat sink; wherein the heat sink is thermally connected to the thermal interface material connected to the top of the TIA die; wherein the heat sink is thermally connected to the thermal interface material thermally connected to the top of the DSP die.

2. The apparatus of claim 1, wherein each tile is enabled to be mounted on a same substrate as the switch by a socket.

3. The apparatus of claim 2, wherein each tile of the set of tiles has a substrate and wherein the DSP die is flip chip bonded to the tile substrate; wherein the PIC die is wire bonded to the tile substrate.

4. The apparatus of claim 1, wherein each tile of the plurality of tiles has a short fiber jumper enabling a multi-fiber connection.

5. The apparatus of claim 1, wherein the set of tiles has 16 tiles.

6. The apparatus of claim 1, wherein each tile of the set of tiles converts optical signals to electrical signals and converts electrical signals to optical signals.

7. The apparatus of claim 4, wherein short is a length less than 6 cm.

8. The apparatus of claim 1, wherein each tile of the set of tiles has a short fiber connect optically connecting the tile to an MPO connector.

9. The apparatus of claim 1, wherein each tile of the set of tiles are connected to the switch by a socket.

10. The apparatus of claim 1 wherein the DSP die is mounted to the tile substrate.

11. The apparatus of claim 1, wherein a thermally connected material is connected to a top of the heat sink of the tile.

12. The apparatus of claim 11, wherein the switch includes a lid, wherein the lid is thermally connected to a heat sink of each tile of the set of tiles.

13. The apparatus of claim 2, wherein the tile is held into the socket by securing the tile to the switch with a screw threaded through a screw hole in the tile.

14. The apparatus of claim 4, wherein the fiber jumper is epoxied to the tile.

15. The apparatus of claim 1, wherein a known-good tile is soldered directly to a main substrate.

* * * * *